US006730175B2

(12) United States Patent
Yudovsky et al.

(10) Patent No.: US 6,730,175 B2
(45) Date of Patent: *May 4, 2004

(54) CERAMIC SUBSTRATE SUPPORT

(75) Inventors: Joseph Yudovsky, Campbell, CA (US); Salvador P. Umotoy, Antioch, CA (US); Shamouil Shamouilian, San Jose, CA (US); Ron Rose, San Jose, CA (US); Rita Dukes, San Jose, CA (US); Xiaoxiong Yuan, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 66 days.

This patent is subject to a terminal disclaimer.

(21) Appl. No.: 10/055,634

(22) Filed: Jan. 22, 2002

(65) Prior Publication Data

US 2003/0136520 A1 Jul. 24, 2003

(51) Int. Cl.$^7$ .......................... H01L 21/00; C23C 16/00
(52) U.S. Cl. .................. 118/728; 118/725; 118/500; 219/444.1; 219/544; 156/345.51; 156/345.52
(58) Field of Search ................. 118/725, 728, 118/500; 156/345.52; 219/444.1, 544

(56) References Cited

U.S. PATENT DOCUMENTS

| 5,155,652 A | 10/1992 | Logan et al. ............... 361/234 |
| 5,242,501 A | 9/1993 | McDiarmid ................. 118/728 |
| 5,275,683 A | 1/1994 | Arami et al. ............... 156/345 |
| 5,280,156 A | 1/1994 | Niori et al. ................. 219/385 |
| 5,306,895 A | 4/1994 | Ushikoshi et al. .......... 219/385 |
| 5,350,720 A | 9/1994 | Kawada et al. ............. 501/97 |
| 5,383,971 A | 1/1995 | Selbrede .................... 118/728 |
| 5,462,603 A | 10/1995 | Murakami .................. 118/719 |
| 5,476,548 A | 12/1995 | Lei et al. .................... 118/728 |
| 5,505,779 A | 4/1996 | Mizuno et al. ............. 118/719 |
| 5,516,367 A | 5/1996 | Lei et al. .................... 118/725 |
| 5,581,874 A | 12/1996 | Aoki et al. .................. 29/825 |
| 5,643,483 A | 7/1997 | Kubota et al. .............. 219/543 |
| 5,665,260 A | 9/1997 | Kawada et al. ............. 219/464 |
| 5,676,758 A | 10/1997 | Hasegawa et al. ......... 118/173 E |
| 5,688,331 A | 11/1997 | Aruga et al. ................ 118/725 |
| 5,695,568 A | 12/1997 | Sinha et al. ................ 118/729 |
| 5,721,062 A | 2/1998 | Kobayashi .................. 428/688 |
| 5,766,363 A | 6/1998 | Mizuno et al. ............. 118/725 |
| 5,796,074 A | 8/1998 | Edelstein et al. ........... 219/390 |
| 5,800,686 A | 9/1998 | Littau et al. ............... 204/298.07 |

(List continued on next page.)

FOREIGN PATENT DOCUMENTS

| EP | 0 668 607 | 8/1995 | .......... H01L/21/00 |
| WO | 99/67440 | 12/1999 | .......... C23C/16/44 |

OTHER PUBLICATIONS

Lei, et al. "Ceramic Substrate Support", U.S. patent application Ser. No. 09/596,854, filed Jun. 19, 2000.

Yudovsky, et al. "Self Aligning Non Contact Shadow Ring Process Kit" U.S. patent application No. 09/459,313 filed Dec. 10, 1999.

Shamouillian, et al. "Multi–Layer Ceramic Electrostatic Chuck with Integrated Channel" U.S. patent application No. 09/149,807 filed Sep. 8, 1998.

*Primary Examiner*—Gregory Mills
*Assistant Examiner*—Ram N Kackar
(74) *Attorney, Agent, or Firm*—Moser Patterson Sheridan

(57) ABSTRACT

A substrate support assembly for supporting a substrate during processing is provided. In one embodiment, a support assembly includes a ceramic body having an embedded heating element and a base plate. The base plate and the ceramic body define a channel therebetween adapted to supply purge gas to a perimeter of a substrate disposed on the support assembly. The base plate is fastened to the body by brazing, adhering, fastening, press fitting or by mating engaging portions of a retention device such as a bayonet fitting.

30 Claims, 7 Drawing Sheets

U.S. PATENT DOCUMENTS

| | | | |
|---|---|---|---|
| 5,854,468 A | 12/1998 | Muka | 219/443 |
| 5,882,419 A | 3/1999 | Sinha et al. | 118/729 |
| 5,886,863 A | 3/1999 | Nagasaki et al. | 361/234 |
| 5,904,872 A * | 5/1999 | Arami et al. | 219/444.1 |
| 5,935,338 A | 8/1999 | Lei et al. | 118/725 |
| 6,035,101 A | 3/2000 | Sajoto et al. | 392/416 |
| 6,045,862 A | 4/2000 | Mizukami et al. | 427/248.1 |
| 6,074,696 A | 6/2000 | Sato | 427/248.1 |
| 6,113,702 A * | 9/2000 | Halpin et al. | 118/725 |
| 6,113,704 A * | 9/2000 | Satoh et al. | 118/728 |
| 6,189,482 B1 | 2/2001 | Zhao et al. | 118/723 R |
| 6,223,447 B1 | 5/2001 | Yudovsky et al. | 34/58 |
| 6,267,839 B1 | 7/2001 | Shamouilian et al. | 156/345 |

* cited by examiner

CERAMIC SUBSTRATE SUPPORT

This application is related to U.S. patent application Ser. No. 09/596,854, filed Jun. 19, 2000, which is hereby incorporated by reference in its entirety.

BACKGROUND OF THE DISCLOSURE

1. Field of Invention

Embodiments of the invention relate generally to an apparatus for supporting a substrate in a semiconductor processing chamber.

2. Background of the Invention

Integrated circuits have evolved into complex devices that can include millions of transistors, capacitors and resistors on a single chip. The evolution of chip designs continually requires faster circuitry and greater circuit density that demand increasingly precise fabrication processes. One fabrication process frequently used is chemical vapor deposition (CVD).

Chemical vapor deposition is generally employed to deposit a thin film on a substrate or semiconductor wafer. Chemical vapor deposition is generally performed in a vacuum chamber having a heated substrate support. The substrate is typically secured by vacuum to the heated substrate support to facilitate uniform temperature control across the surface of the substrate. A precursor gas is typically directed through a showerhead situated near the top of the chamber. The precursor gas reacts to form a layer of material on a surface of the substrate that is positioned on a heated substrate support. Purge gas is routed through holes in the support to the edge of the substrate to prevent deposition at the substrate's edge or backside. Volatile by-products produced during the reaction are pumped from the chamber through an exhaust system.

One material frequently formed on substrates using a chemical vapor deposition process is tungsten. Precursor gases that may be used to form tungsten generally includes tungsten hexafluoride ($WF_6$) and silane. As the silane and tungsten hexafluoride mix, some tungsten (i.e., tungsten that does not deposit on the substrate) deposits on the showerhead and other chamber components. The tungsten film that builds on the showerhead may become a source of contamination in the chamber. Eventually, the tungsten build-up may clog the holes in the showerhead that facilitate the passage of the precursor gas therethrough necessitating the showerhead be removed and cleaned or replaced.

To extend the interval in time between the routine maintenance of the showerhead, fluorine based chemistries are generally used to clean (i.e., etch away) the stray tungsten film. However, the use of fluorine, while advantageous for removing tungsten, reacts to form a layer of aluminum fluoride on the heated substrate support that is commonly made of aluminum. The aluminum fluoride layer has a generally rough surface topography. The rough surface creates a leak path that impairs the vacuum used to chuck or hold the substrate to the heated support. Additionally, the aluminum fluoride layer is a potential source of particulate contamination.

Substrate supports fabricated from ceramic materials provide an improvement over aluminum supports due to ceramic's lack of reactivity with fluorine. However, ceramic supports are difficult to fabricate. For example, the holes in ceramic supports used to provide purge gas to the perimeter of the support are typically drilled from the perimeter of the support to a depth generally equal to the radius of the support. Drilling such a deep hole in ceramic is difficult. The tools used to make these holes are frequently broken during the fabrication (e.g., drilling) process. Broken tools disposed within the support must be removed or the support must be scrapped. These fabrication difficulties result in costly supports and an undesirable high scrap rate.

Alternatively, radial purge gas passages may be formed by sintering or fusing two ceramic plates to enclose the passages as described in the previously incorporated U.S. patent application Ser. No. 09/596,854. However, this technique results in a costly support as well.

Therefore, there is a need for an improved support for chemical vapor deposition processes.

SUMMARY OF INVENTION

One aspect of the present invention generally provides a substrate support assembly for supporting a substrate during processing. In one embodiment, a support assembly for supporting a substrate during processing includes a ceramic body having an embedded heating element and a base plate. The base plate and the ceramic body define a channel therebetween adapted to supply purge gas to a perimeter of the substrate disposed on the support assembly. The base plate is fastened to the body by brazing, adhering, fastening, press fitting or by mating engaging portions of a retention device such as a bayonet fitting.

In another embodiment, a support assembly includes a ceramic body having an embedded heating element coupled to a stem. A base plate is removably disposed adjacent the ceramic body and defines a channel therebetween adapted to supply purge gas to a perimeter of the substrate disposed on the support assembly.

BRIEF DESCRIPTION OF DRAWINGS

A more particular description of the invention, briefly summarized above, may be had by reference to the embodiments thereof, which is illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures.

DETAIL DESCRIPTION OF INVENTION

The present invention generally provides a processing system and heated substrate support that are advantageous for the deposition of tungsten films. The invention is illustratively described below with reference to a chemical vapor deposition system, such as a WxZ™ metal chemical vapor deposition (MCVD) system, available from Applied Materials, Inc., of Santa Clara, Calif. However, it should be understood that the invention has utility when depositing other films and in other system configurations such as physical vapor deposition systems, chemical vapor deposition systems and any other system in which supporting a substrate on a ceramic support is desired.

Figure 1:
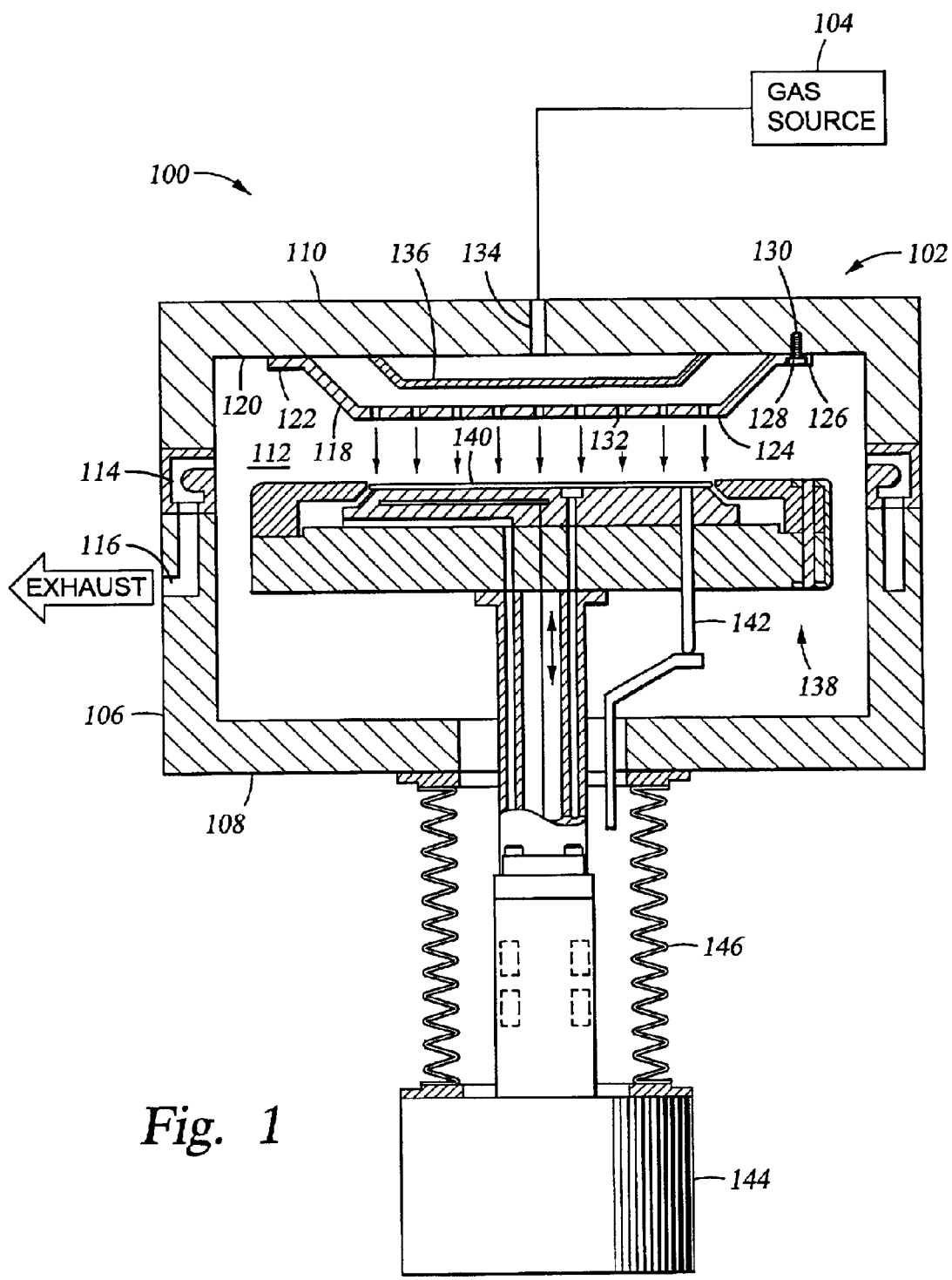
FIG. 1 is a schematic sectional view of one embodiment of a processing chamber of the present invention.

FIG. 1 is a cross-sectional view of one embodiment of a chemical vapor deposition system 100. The system generally includes a chamber 102 coupled to a gas source 104. The chamber 102 has walls 106, a bottom 108 and a lid 110 that define a process volume 112. The walls 106 and bottom 108 are typically fabricated from a unitary block of aluminum. The walls 106 include a port (not shown) that facilitates entry and egress of substrate 140 from the chamber 102. The chamber 102 contains a pumping ring 114 that couples the process volume 112 to an exhaust port 116 (that includes various pumping components not shown).

The lid 110 is supported by the walls 106 and can be removed to service the chamber 102. The lid 110 is generally comprised of aluminum and may additionally contain heat transfer fluid channels for regulating the temperature of the lid 110 by flowing heat transfer fluid therethrough.

A showerhead 118 is coupled to an interior side 120 of the lid 110. The showerhead 118 is typically fabricated from aluminum. The showerhead generally includes a perimeter mounting ring 122 that surrounds a "dishshaped" center section 124. The mounting ring 122 includes a plurality of mounting holes 126 passing therethrough, each accepting a vented mounting screw 128 that threads into a mating hole 130 in the lid 110. The center section 124 includes a perforated area 132.

A mixing block 134 is disposed in the lid 110. The mixing block 134 is coupled to the gas source 104 such that process and other gases may be introduced to the process volume 112 by passing through the mixing block 134 and showerhead 118. A blocker plate 136 disposed between the showerhead 118 and the mixing block 134 increases the uniform distribution of gases passing through the showerhead 118 into the chamber 102.

A support assembly 138 is disposed beneath the showerhead 118. The support assembly 138 supports a substrate 140 during processing. Generally, the support assembly 138 is coupled to a lift system 144 that moves the support assembly 138 between an elevated position as shown and a lowered position. Bellows 146 provides a vacuum seal between the process volume 112 and the atmosphere outside the chamber 102 while facilitating the movement of the support assembly 138. Lift pins 142 and the associated mechanisms are shown and are generally known in the art.

Figure 2A:
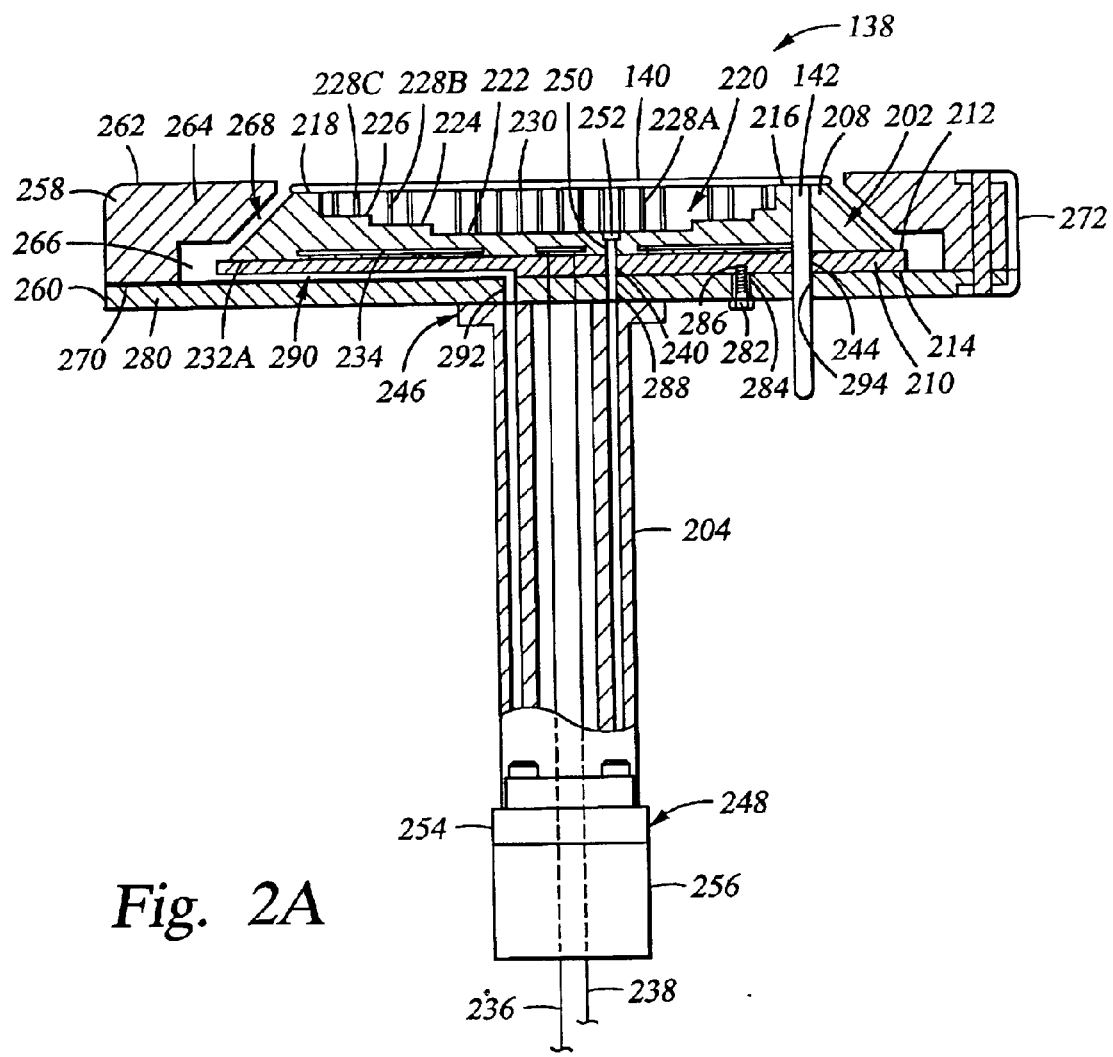
FIG. 2A is a partial sectional view of a substrate support assembly.

FIG. 2A depicts the support assembly 138 in cross-section. The support assembly 138 generally includes a substrate support body 202, a base plate 280 and a stem 204. The substrate support body 202 generally includes at least one heating element, such as a resistive heater 234. The embedded resistive heater 234 is coupled to a power source (not shown). The power source supplies power to the resistive heater 234 to enable the support body 202 to heat the substrate 140 to a desired temperature, typically between about 300 to about 550 degrees Celsius. Alternatively, the heating element may comprise thermal electric devices, conduits for flowing a heat transfer fluid and/or other heating or cooling mechanisms.

In the embodiment depicted in FIG. 2A, the substrate support body 202 is comprised of a first (upper) plate 208 and a second (lower) plate 210. The resistive heater 234 may be disposed in the upper plate 208 (as shown), the lower plate 210 or between the upper and lower plates 208, 210. The upper plate 208 supports the substrate 140 during processing. The lower plate 210 generally has a first side 212 that is connected to the upper plate 208 and a second side 214 that is connected to the stem 204. The upper plate 208 and lower plate 210 are typically fused together, for example, by clamping the plates 208 and 210 together at an elevated temperature for a period of time, typically without a bonding agent. Alternatively, the plates may be coupled by sintering, adhesives, mechanical means (i.e., fasteners), and the like.

The upper plate 208 is fabricated from ceramic, such as aluminum nitride, aluminum oxide or doped ceramics such as alumina doped with titanium oxide or chromium oxide, doped aluminum oxide, doped boron-nitride and the like. In one embodiment, about 95 percent pure aluminum nitride is used to enhance the thermal conductivity of the upper plate 208. The upper plate 208 includes a first or support surface 216 and a second surface 232A. The support surface 216 has a seal ring 218 that projects from the perimeter of the support surface 216. The seal ring 218 supports the substrate 140 at its perimeter and provides a seal therebetween to facilitate vacuum chucking of the substrate. The support surface 216 includes stepped surface 220 disposed radially inside the seal ring 218 that enhance the temperature uniformity of the substrate seated on the support surface 216.

In one embodiment, the stepped surface 220 includes a center portion 222, an intermediate portion 224 and an outer portion 226. The center portion 222 is orientated parallel to a plane defined by the seal ring 218. The intermediate portion 224 is orientated parallel to the center portion 222. The intermediate portion 224 is positioned between the center portion 222 and the seal ring 218. The outer portion 226 is orientated parallel to the center portion 222. The outer portion 226 is positioned between the intermediate portion 224 and the seal ring 218. Generally, 0.001 inches separate the planes defined by the portions 222, 224 and 226.

A plurality of posts 228A, 228B and 228C are disposed on the stepped surface 220 (e.g., portions 222, 224 and 226). The posts 228A, 228B and 228C are typically integral formed with the upper plate 208 by patterning the stepped surface 220 while the upper plate 208 is in a green state. The posts 228A are positioned in the center portion 222. The posts 228B are positioned in the intermediate portion 224 and the posts 228C are positioned in the outer portion 226. The posts 228A are slightly longer than the posts 228B and 228C. The posts 228B are slightly longer than the posts 228C. Each of the posts 228A, 228B and 228C includes a distal end 230 that lie in a common plane. The plane defined by the distal ends 230 may be substantially co-planar to the plane of the seal ring 218, such that the substrate is supported on the distal ends 230 of the posts 228A, 228B and 228C during processing without damaging the substrate by excessive flexing (i.e., bowing the substrate across the seal ring and posts).

The stepped surface 220 provides a larger gap between the substrate and the center portion 222 to compensate for the tendency of the substrate to transfer heat to its center. Thus, the variable gap created between the substrate and the stepped surface 220 promotes better chucking effect for substrate 140 since size of caps and plural posts can be designed to attain better temperature uniformity by controlling the distance and contact area between the support surface 2126 and the substrate 140. For example, the temperature uniformity across the support assembly 138 can be within about 3 degrees Celsius.

A vacuum port 250 is disposed through the upper plate 208. Vacuum applied through the port 250 secures the substrate 140 to the support surface 216 to enhance temperature control while preventing the substrate being moved by purge gas disposed proximate the edge of the substrate. The vacuum port 250 has a varied cross-section that includes an expanded portion 252 on the support surface 216 that has a generally larger cross-sectional area relative to the other portions of the vacuum port 250. In one embodiment, the expanded portion 252 comprises a slot having a full radius at each end. The expanded portion 252 serves to decrease the pressure drop at the interface of the vacuum port 250 and support surface 216 during the application of the vacuum. The decreased pressure drop proximate the vacuum port 250 correspondingly limits cooling associated with the change in pressure thereby enhancing substrate temperature uniformity, and consequently deposition uniformity on the substrate 140. One skilled in the art will readily identify that the expanded portion 252 may be configured in other geometries to accomplish the pressure reduction at the surface 216.

The lower plate 210 is typically fabricated from ceramic, such as aluminum nitride, aluminum oxide or doped ceramics such as alumina doped with titanium oxide or chromium oxide, doped aluminum oxide, doped boron-nitride and the like. In one embodiment, about 95 percent pure aluminum nitride is used to enhance the thermal conductivity of the lower plate 210. However, alternative materials may be used.

Figure 2B:
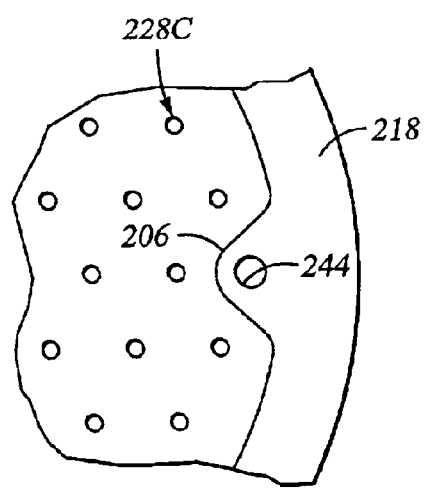
FIG. 2B is a partial plan view of the substrate support assembly.

The lower plate 210 additionally includes a vacuum passage 240 and a plurality of lift pin passages 244 extending therethrough. The lift pin passages 244 are generally disposed radially outwards from the vacuum passage 240. The lift pin passages 244 extend from the lower plate 210 through upper plate 208, exiting the upper plate 208 through a tab 206 extending inwards and coplanar to the seal ring 218. (See, FIG. 2B). The vacuum passage 240 is generally positioned offset to the centerline of the lower plate 210.

The base plate 280 is generally coupled to the second side 214 of the lower plate 210 in a manner that allows for relative movement between the plates 280, 210 due to thermal expansion. The base plate 280 may be bonded, brazed, adhered, secured by fasteners, threaded or press fit to the lower plate 210. The base plate 280 may be alternatively coupled by a bayonet fitting, interlocking geometry or otherwise engaged to the lower plate 210 in a manner that maintains their relative position through the operating temperature of the support assembly 138. In the embodiment depicted in FIG. 2A, the base plate 280 is fastened by a plurality of fasteners 282 (one of which is shown) which pass through a oversized hole or slot 284 in the base plate 280 and mate with a threaded hole or insert 286 disposed in the second side 214 of the lower plate 210. The slot 284 allows the base plate 280 and body 202 to expand at different rates in response to thermal changes without damage.

The base plate 280 is typically fabricated from a ceramic material, such as aluminum nitride, aluminum oxide, or a metal such as aluminum. However, the base plate 280 may alternatively be fabricated from materials compatible with process chemistry and environment, including metals and dielectric materials, such as aluminum, stainless steel.

The base plate 280 includes a vacuum passage 288, a purge gas passage 292 and a plurality of lift pin passages 294. The vacuum passage 288 is aligned and fluidly coupled with the vacuum passage 250. The purge passage 292 generally allows purge gas to be routed from the stem 204 to the support body 202. The lift pin passages 294 generally align with the lift pin passages 244 to allow the lift pins 142 to pass therethrough.

The base plate 280 has a perimeter section 260 that extends beyond the lower plate 210. The perimeter section 260 supports a shadow ring 258. The shadow ring 258 generally is annular in form and is typically comprised of ceramic such as aluminum nitride. The shadow ring 258 has a first side 270 and a second side 262. The first side 270 is supported by the perimeter 260. The second side 262 has a lip 264 extending radially inward. The lip 264 and the base plate 280 generally enclose the plenum 266 that receives a purge gas from a purge gas source (not shown). The purge gas is disposed about the perimeter of the substrate 140 through a gap 268 that communicates with the plenum 266 defined between the lip 264 and the support body 202. The purge gas flows from the plenum 266 and over the edge of the substrate 140 to prevent deposition at the substrate's edge. A clip assembly 272 is utilized to retain the ring 258 to the base plate 280. An example of a clip assembly 272 is described in U.S. Pat. No. 6,223,447, issued May 5, 2001 to Yudovsky, which is hereby incorporated by reference in its entirety.

A channel 290 is formed between the lower plate 210 and the base plate 280. Generally, the channel 290 provides a passage for the purge gas between the stem 204 and the plenum 266 defined between the shadow ring 258 and the base plate 280. As the purge gas which may inadvertently leak from the channel 290 below the substrate 140 is generally inert to the deposition process, the integrity of the channel 290 is not paramount and accordingly does not require leak-tight coupling of the base plate 280 and ceramic body 202 or fabrication as a singular ceramic member, thus allowing substantial fabrication savings to be realized over support assemblies with have channels radially formed within a singular unit of material or body comprised of sintered or fused laminations. As the base plate 280 and the ceramic body 202 union is not required to be gas-tight, the base plate 280 may be fabricated from a material having different thermal expansion coefficients as the integrity of sintered or fused joints over large temperature cycles are not a design consideration. For example, the ceramic body 202 may be fabricated from a lower purity of aluminum nitride than the base plate 280. In another example, an aluminum nitride body 202 may be coupled to a base plate 280 comprised of aluminum oxide or aluminum among other materials.

Typically, the channel 290 is formed in the lower plate 210. Optionally, a portion or all of channel 290 may be disposed completely in the base plate 280. Optionally, some or all of the channel 290 may be disposed at least partially in the lower plate 210 and at least partially in the base plate 280 or various combinations thereof. Common to these embodiments is that the mating of the surfaces of the lower and base plates 210, 280 define the channels 290 and confines travel of fluids thereto.

Figure 3A:
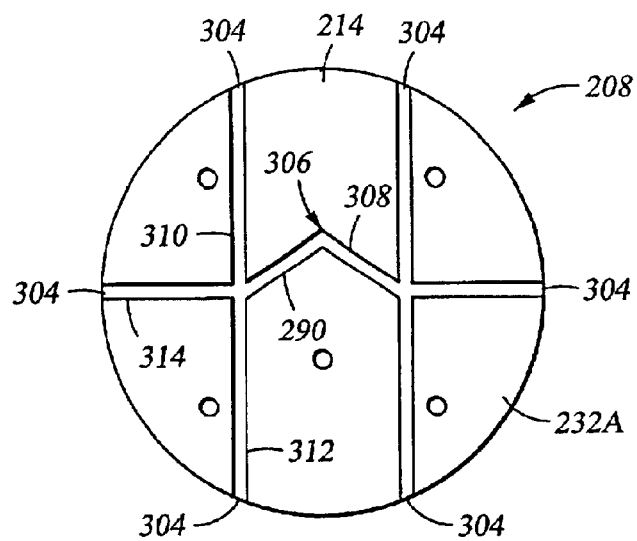
FIG. 3A illustrates one embodiment of a surface of an upper plate.

FIG. 3A depicts one embodiment of the second side 214 of the lower plate 210. In one embodiment, the channels 290 are formed in the second side 214 of the body 202. The channels 290 are configured to fluidly couple a plurality of outlets 304 to a central origin 306. A fluid source (not shown) supplies a fluid (e.g., purge gas) through the channels 290 from the central origin 306 to the outlets 304. As it is preferable to maintain substantially the same pressures at each outlet 304 when the outlets are spaced equidistantly about the perimeter of the second side 214A, the geometry (i.e., cross-sectional area) is tuned for each "leg" of the channels 290 to achieve this goal. As one skilled in the art will appreciate, the cross-section of each leg of the channel 290 will depend on the desired pressure at the outlets 304 downstream of each leg and the flow losses encountered therebetween. The flow losses include such factors such as the surface roughness and geometry of the leg, number of outlets 304 downstream of the leg, the length of each downstream leg, the flow properties of the fluid and the like.

In the exemplary embodiment, the channels 290 include a chevron-shaped primary channel 308 positioned offset from the center of the lower plate 210. The origin 306 is positioned at the mid-point of the chevron. Each end of the primary channel 308 branches into a first secondary channel 310, a second secondary channel 312 and a third secondary channel 314. The secondary channels 310, 312 and 314 couple the primary channel 308 to the outlets 304. The first secondary channel 310 and the secondary channel 312 are co-linearly orientated and have identical cross-sections. The third secondary channel 314 is orientated substantially perpendicular to the first and second secondary channels 310, 312. As the third secondary channel 314 is shorter in length than the first and second secondary channels 310, 312, the cross-sectional area of the third secondary channel 314 is less than that of the first and second secondary channels 310, 312 to balance the flow of purge gas passing through the outlets 304. Optionally, flow restrictors may be placed in the outlets 304 or elsewhere in the channel to balance the flow.

Alternatively, the outlets 304 may be positioned at varying distances about the second side 214A. In such an orientation, the flow of purge gas from the outlets 304 is desired to be non-uniform as to balance the flow of purge gas at the substrate's edge described further below. The flow of gas may be balanced by controlling the cross-sections and lengths of the various channels as desired to tune the gas flow for the particular application.

Figure 3B:
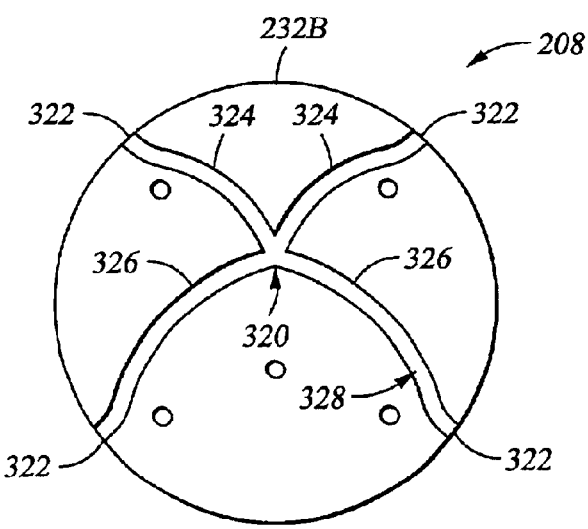
FIG. 3B illustrates another embodiment of a surface of an upper plate.

FIG. 3B depicts another embodiment of a second side 214B of the lower plate 210. Channels 328 are formed in the second side 214B of the lower plate 210 to distribute purge gas from a central origin 320 to a plurality of outlets 322. In one embodiment, four outlets 322 are disposed equidistant about the perimeter of the second side 214B. The outlets 322 that are closest to the central origin 320 have passages 324 disposed between the central origin and the respective outlets to provide a conduit for the purge gas. The outlets 322 that are farthest from the central origin 320 have passages 326 disposed between the central origin and the respective outlets to provide a conduit for the purge gas. To provide a uniform distribution of purge gas to the perimeter of the second surface 232B, the total flow restriction between the passages 324, 326 is balanced. Generally, this may be accomplished by having the cross-sectional area of passages 326 greater than the cross-sectional area of passages 324.

Figure 3C:
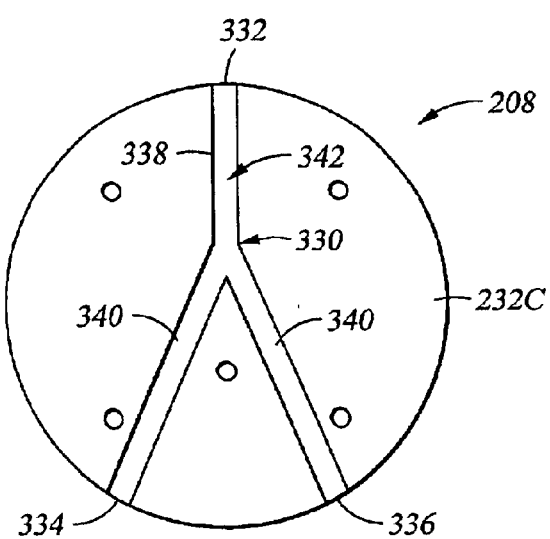
FIG. 3C illustrates another embodiment of a surface of an upper plate.

FIG. 3C depicts yet another embodiment of a second side 214C of the lower plate 210. Channels 342 are formed in the second side 214C of the upper plate 208 to distribute purge gas from a central origin 330 to a plurality of outlets. In one embodiment, three outlets 332, 334 and 336 are disposed at varying distances about the perimeter of the second side 214C. The outlet 332 that is closest to the central origin 330 has a passage 338 disposed between the central origin and the outlet to provide a conduit for the purge gas. The outlets 334 and 336 that are farthest from the central origin 320 have passages 340 disposed between the central origin and the respective outlets to provide a conduit for the purge gas. To provide a uniform distribution of purge gas around the substrate, the flow of purge gas through the outlet 322 must be greater than the flow through either of the outlets 334 and 336 to balance the purge gas flowing to the perimeter of the substrate. Generally, this may be accomplished by having the cross-sectional area of passage 338 greater than the cross-sectional area of passages 340. Other configurations of the channels 290 are contemplated.

Figure 4:
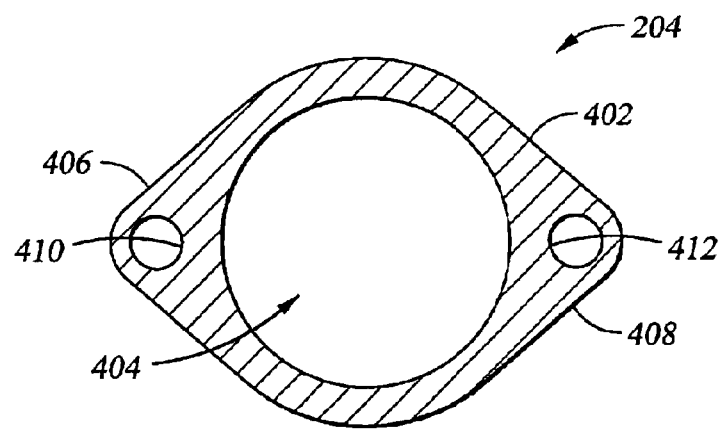
FIG. 4 is a cross-section view of a stem.

FIG. 4 depicts the stem 204 in cross-section. The stem 204 generally is fabricated from ceramic, such as aluminum nitride. However, alternative materials may be utilized. Typically about 99 percent pure aluminum nitride is utilized to minimize thermal transfer between the support body 202 and stem 204. The stem 204 is generally tubular in cross-section. The stem 204 has an annular section 402 that defines a central passage 404. A first projection 406 and a second projection 408 extend from the annular section 402. The first projection 406 has a purge gas passage 410 and the second projection 408 has a vacuum passage 412 respectively disposed therethrough. The thickness of the annular section 402 and the walls of the first and second projections 406, 408 are selected to minimize thermal conductivity therethrough.

Returning to FIGS. 2A and 4, the stem 204 has a first end 246 and a second end 248. The first end 246 of the stem 204 is connected (e.g., fused, fastened, adhered, bonded or sintered) to the base plate 280. The leads 236, 238 pass through the central passage 404 of the stem 204 and are coupled to a power source (not shown). The union of the stem 204 and the base plate 280 places the purge gas passage 410 disposed in the stem 204 in fluid communication with the purge gas passage 292 of the base plate 280 and the channels 290. Purge gas provided from a purge gas supply (not shown) may be fed through the stem 204 and out the gap 268 disposed between the substrate support body 202 and shadow ring 258 to minimize deposition at the substrate's edge. Similarly, the union of the stem 204 and the base plate 280 permits the vacuum passage 414 disposed in the stem 204 to be in fluid communication with the vacuum passage 288, 240 of the base and lower plates 280, 210 and the vacuum port 250 of the upper plate 208. A vacuum source (not shown) maintains a vacuum between the substrate 140 and the stepped surface 220 to retain the substrate 140 during processing by evacuating the volume between the substrate 140 and stepped surface 220 through the stem 204. The controlled cross-section of the stem 204 minimizes the thermal transfer between the stem 204 and the substrate support body 202.

An isolator 254 is disposed at the second end 248 of the stem 204 to minimize the thermal transfer therefrom. The isolator 254 is typically comprised of a thermally insulative material compatible with the process environment such as a polymer. In one embodiment, the isolator 254 comprises a polyimide, for example VESPEL®.

A heat transfer block 256 couples the stem 204 to the lift system 144. Generally, the heat transfer block 256 is used to remove heat from the system 100. The fluid temperature can be specified to control (i.e., increase, maintain, or decrease) the heat transfer of shaft 204 to heat transfer block 256, to achieve required thermal uniformity of support body 202. The heat transfer block 256 is generally a thermally conductive material such as aluminum. The heat transfer block 256 isolates the bellows 146 and lift system 144 from the high temperatures associated with the support assembly 138.

In operation, the semiconductor substrate 140 depicted in FIG. 1 is secured to the support assembly 138 by providing a vacuum therebetween. The expanded portion 252 of the vacuum port 250 minimizes the local pressure drop and corresponding temperature change of gases being drawn into the vacuum port 250, thus preventing localized cooling of the substrate directly above the vacuum port 250.

The temperature of the substrate 140 is elevated to a predetermined process temperature primarily providing power to the resistive heater 234. The stepped surface 220 provides a variable gap that counters the tendency of the substrate 140 to have a higher temperature at the center of the substrate 140. During the deposition process, the substrate 140 is heated to a steady state temperature. Using thermal control of both the lid 110 and the support assembly 138, the substrate 140 is maintained at a temperature of about 300 to about 550 degrees Celsius.

Gaseous components, which in one embodiment may include silane and tungsten hexafluoride, are supplied from a gas panel to the process chamber through mixing block 134 and showerhead 118 to form a gaseous mixture. The gaseous mixture reacts to form a layer of tungsten on the substrate 140. To prevent deposition at the substrate's edge and possible adherence of substrate 140 to the support assembly 138, purge gas is flowed into the plenum 266 from the channels 290 defined between the base plate 280 and support body 202 and distributed through the gap 268 between the shadow ring 258 and the support body 202 to the perimeter of the substrate 140.

Figure 5:
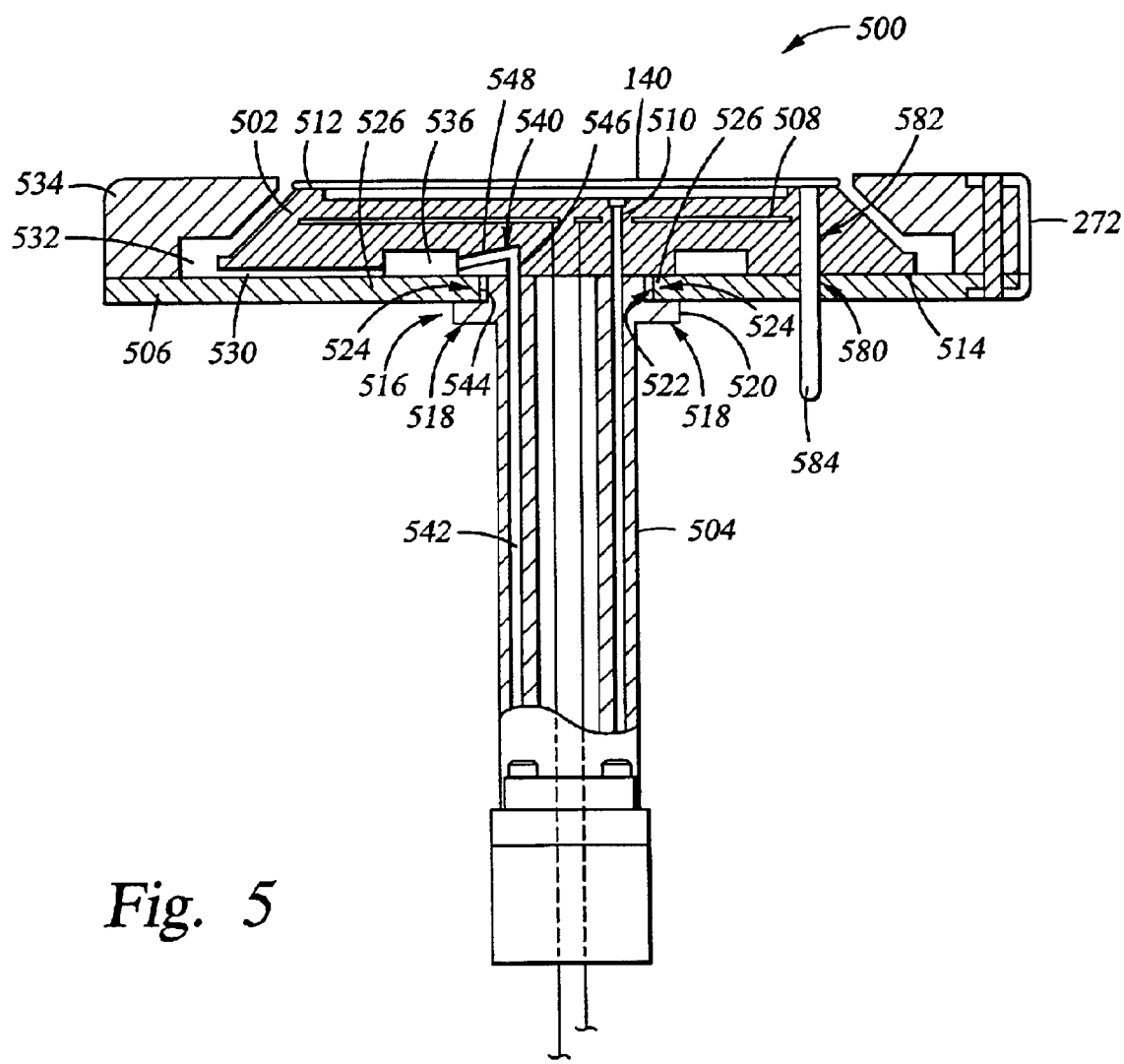
FIG. 5 is a sectional view of another embodiment of a substrate support assembly.

FIG. 5 depicts another embodiment of a support assembly 500. The support assembly 500 generally includes a support body 502, a stem 504 and a removable base plate 506. The support body 502 is generally comprised of a singular mass of ceramic having a heater element 508 such as resistive heater or fluid conduit embedded therein. For example, the support body 502 may be fabricated from ceramic material in a green or powder state having the heater element 508 embedded therein. The green support body 502 is fired to sinter the body 502 and heater element 508 into a unitary body. Other fabrication techniques may alternatively be utilized.

The support body 502 has a first surface 512 adapted to support the substrate 140 and an opposing second surface 514 that is coupled to the stem 504. A vacuum passage 510 generally is disposed between the first surface 512 and the second surface 514 of the support body 502. The vacuum passage 510 is coupled to a vacuum source (not shown) through the stem 504. The first surface 512 may include topography (not detailed), which enhances vacuum distribution and/or heat transfer between the substrate 140 and support body 502, such as described above with reference to the support body 202.

A retaining device 516 removably secures the base plate 506 in a position adjacent the second surface 514 of the support body 502. The retaining device 516 generally includes interacting or mating features that are selectively engaged to secure the base plate 506 to the support assembly 500. Some examples of retaining devices 516 includes thread forms and bayonet fittings among others. Alternatively, the retaining device 516 may be a fastener which allows for thermal expansion between the support body 502 and base plate 506 such as a screw and slotted hole as described with reference to FIG. 2A.

Generally, one or more first features 518 of the retaining device 516 extend from the second surface 514 of the support body 502 and/or stem 504. In the embodiment depicted in FIG. 5, the stem 504 includes two first features 518, each of which comprises a flute 520 extending outwardly from the stem 504. The flutes 520 are typically disposed parallel and in spaced-apart relation to the second surface 514 of the support body 202. A groove 522 is defined between the flutes 520 and the second surface 514 that selectively accepts a second feature 524 of the retaining device 516 to retain the base plate 506 to the support body 502.

The base plate 506 includes one or more second features 524 (two are shown) that extend from the base plate 506. In the embodiment depicted in FIG. 5, the second features 524 includes two tabs 526 which can be rotated or snapped into the grooves 522 between the flutes 520 and second surface 514 of the support body 502, thus securing the base plate 506 to the body 502. The tabs 526 are sized to first snugly between the flutes 520 and support body 502, or may includes one or more surface features to create an interference or snap-fit with the flutes 520 and/or the body 502.

Figure 6:
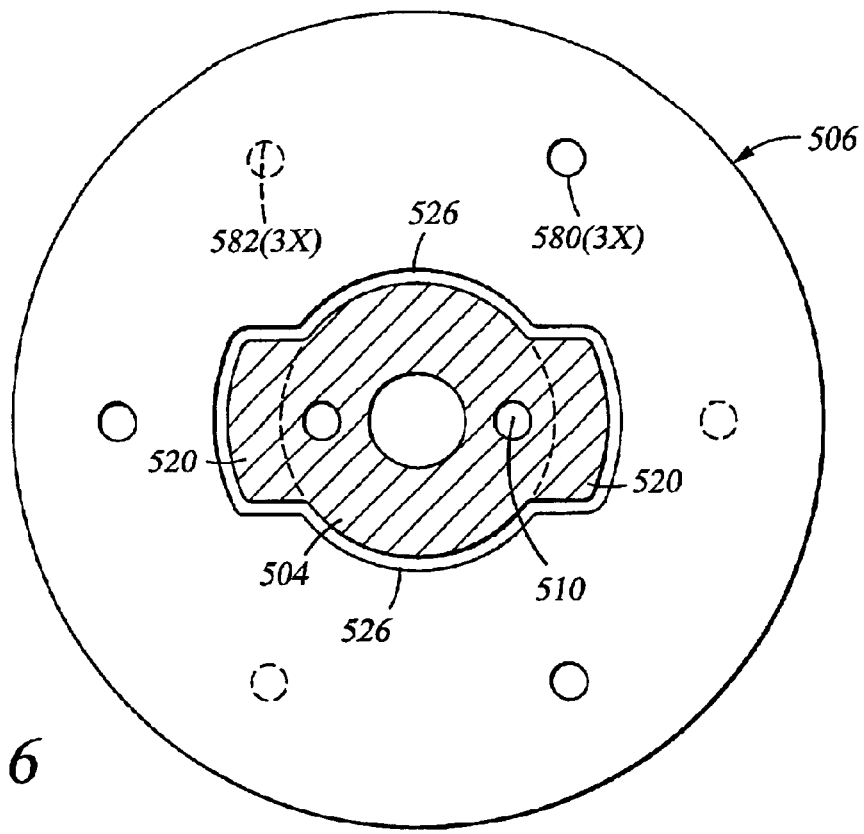
FIG. 6 is a bottom view of one embodiment of a stem and base plate with the stem in cross-section.

Referring to FIGS. 5 and 6, the flutes 520 are generally disposed in a spaced-apart relation to allow entry of the tabs 526 therebetween as the base plate 506 is disposed adjacent the support body 502. As the base plate 506 is rotated, the tabs 526 move into the grooves 522 between the flutes 520 and the body 502 as depicted in FIG. 5. Once the base plate 506 is rotated into a pre-determined position, lift pin passages 580 and 582 disposed respectively through the base plate 506 and support body 502 become aligned, and allow lift pins 584 (shown in FIG. 5) to be disposed therethrough, thus secure the angular rotation of the base plate 506 relative to the support body 502 preventing inadvertent disengagement. Alternatively, one or more pins or screws may be disposed through one of the flutes 520, tabs 526 and/or base plate 506 to prevent the base plate 506 from rotating once engaged with the support body 502. Optionally, the flutes 520 and/or tabs 526 may be tapered to created an interface fit upon engagement.

Figure 7:
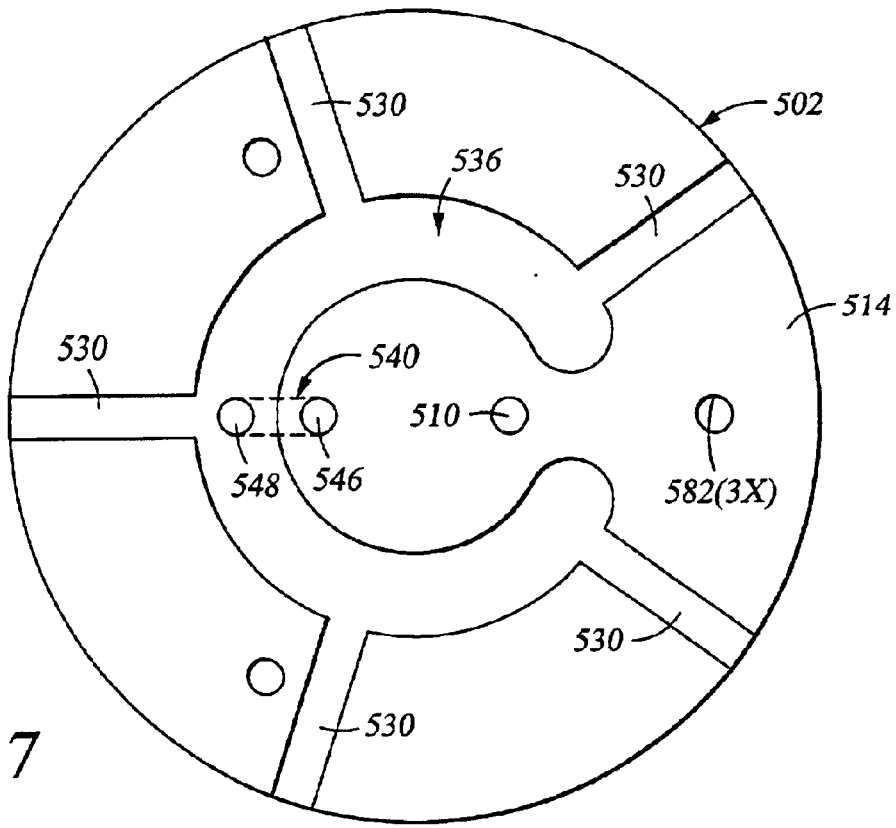
FIG. 7 is a bottom view of one embodiment of a support body.

Referring to FIGS. 5 and 7, one or more channels 530 are formed between the body 502 and the base plate 506. Generally, the channels 530 provide a passage for purge gas from the stem 504 to a plenum 532 defined between a shadow ring 534 and the support body 502. The purge gas flows from the plenum 532 and over the edge of the substrate 140 to prevent deposition at the substrate's edge. In embodiments where multiple channels 530 are utilized, a substantially circular passage 536 is formed in one or both of the base plate 506 and support body 502. The passage 536 has a relatively large sectional area that provides substantially uniform purge gas distribution to the individual channels 530 that promotes uniform gas delivery to the plenum 532.

Typically, the channel 530 is formed in the support body 502. Optionally, a portion or all of channel 530 may be disposed completely in the base plate 506. Optionally, some or all of the channel 530 may be disposed at least partially in the support body 502 and at least partially in the base plate 506 or various combinations thereof. Common to these embodiments is that the mating of the surfaces of the body 502 and the base plate 506 defines the channels 530 and confines travel of fluids thereto. The channel 530 may alternatively be configured similar to the channels described above with reference to FIGS. 2A–3C.

In one embodiment, the leakage of purge gas between the stem 504 and base plate 506 is minimized by providing a aperture 540 for the purge gas between the stem 504 and passage 536 and/or channels 530. In the embodiment depicted in FIG. 5, the aperture 540 includes a first hole 546 that intersects with a second hole 548 to form a radial passage internally formed in the support body 502. The first hole 546 is formed in the second surface 514 of the support body 502 coupled to the stem 506 and extends partially through the support body 502 at an acute angle or perpendicular to the second surface 514. The first hole 546 is aligned and fluidly coupled to a purge passage 542 disposed through the stem 506. The second hole 548 is formed at an acute angle or perpendicular to the second surface 514 and intersects with the first hole 546 within the interior of the support body 202. The second hole 548 couples the first hole 546 with the passage 536 and/or channels 530 that are positioned radially outward of an inner edge 544 of the base plate 504. Thus, potential leakage of purge gas between the inner edge 544 of the base plate 504 and stem 506 is avoided.

Thus, as the base plate and support body do not have to be fused or sintered together, the radial passages formed therebetween may be fabricated in an efficient, cost effective manner relative to conventional ceramic substrates supports. Moreover, since matching of the coefficients of thermal expansion is not requirement, the broadened selection of materials from which the base plate may be fabricated further increases the cost effectiveness of the inventive support assembly.

Figure 8:
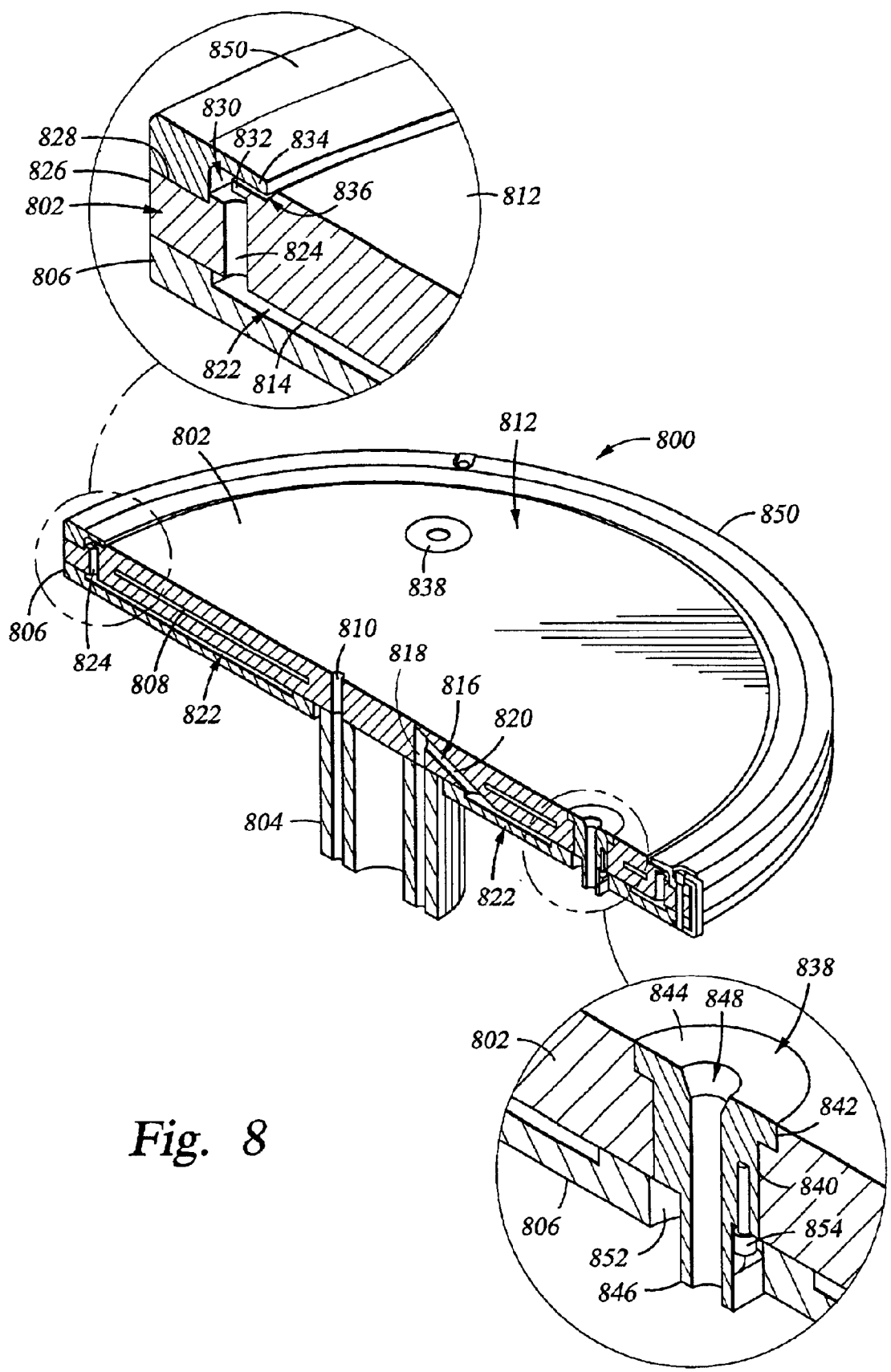
FIG. 8 is a sectional, perspective view of another embodiment of a substrate support assembly.

FIG. 8 depicts another embodiment of a support assembly 800. The support assembly 800 generally includes a support body 802, a stem 804 and a removable base plate 806. The support body 802 is generally comprised of ceramic and includes a heater element 808 such as resistive heater or fluid conduit embedded therein. For example, the support body 802 may be fabricated from ceramic material in a green or powder state having the heater element 808 embedded therein. The green support body 802 is fired to sinter the body 802 and heater element 808 into a unitary body. Other fabrication techniques may alternatively be utilized.

The support body 802 has a first surface 812 adapted to support a substrate and an opposing second surface 814 that is coupled to the stem 804, typically by sintering, bonding or fusing. A vacuum passage 810 generally is disposed between the first surface 812 and the second surface 814 of the support body 802. The vacuum passage 810 is coupled to a vacuum source (not shown) through the stem 804. The first surface 812 may include topography (not detailed), which enhances vacuum distribution and/or heat transfer between the substrate and support body 802, such as described above with reference to the support body 202.

A purge passage 816 is generally disposed through a portion of the body 802. The purge passage 816 is coupled to a purge source (not shown) through the stem 804. The purge passage 816 is configured to bridge the interface between the base plate 806 and the stem 804, thereby fluidly coupling the vacuum source to a purge channel 822 defined between the second side 814 of the body 802 and the base plate 806. The purge passage 816 is generally comprised of a first hole 818 and a second hole 820, both originating on the second side 814 of the body 802 and intersecting within the body 802. Generally, the first and second holes 818, 820 are configured similar to the first and second holes 546, 548 described above.

The purge channel 822 generally extends radially outward from the second hole 820 and fluidly coupled to a plurality of apertures 824 disposed through the body 802. A purge ring 850 is supported on a flange 828 disposed at an edge 826 of the body 802. The purge ring 850 generally includes a lip 834 that extends radially inward therefrom and defines a gap 836 with the first surface 812 of the body 802. As the purge ring 850 is supported by the body 802, thermal or tolerance stack effects on size of the gap 836 and flow of fluid therethrough is minimized. The lip 834 and the flange 828 generally define an annular plenum 830 that is fluidly coupled to the apertures 824 extending through the body 802. Gas flowing into the plenum 830 is directed over the perimeter of the substrate through the gap 836. In one embodiment, the flange 828 is positioned below the plane of the first side 812. A lip 832 extends outward from the first side 812 and into the plenum 830. The lip 832 at least partially covers the apertures 824 so that the purge gas is directed radially around the plenum 830, thereby promoting uniform distribution of the purge gas through the gap 836 and around the substrate.

Figure 9:
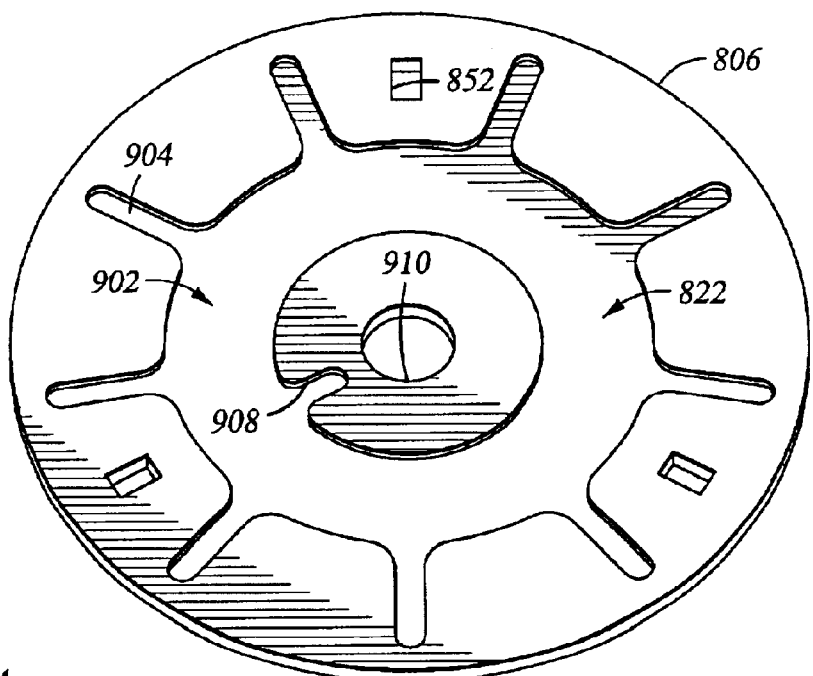
FIG. 9 is a bottom perspective view of another embodiment of a base plate.

FIG. 9 depicts one embodiment of a purge channel 822 formed in the base plate 806. The purge channel 822 generally includes an annular center channel 902 formed in the base plate 806 and at least partially circumscribing a central aperture 910 that allows passage of the stem 804 therethrough. An entrance channel 908 extends radially inward from the center channel 902 to facilitate fluid communication with the second hole 820 and allow gas entry into the purge channel 822 from the stem 804. A plurality of exit channels 904 extend radially outward from the center channel 902 to facilitate fluid communication with the apertures 824 formed through the body 802, thus allowing gas flow from the purge channel 822 to the plenum 830 disposed between the purge ring 850 and the body 802.

Returning to FIG. 8, the support body 802 generally includes a plurality of lift pin guides 838 disposed therethrough. The lift pin guides 836 are typically comprised of a ceramic material similar to the material comprising the body 802. The lift pin guides 836 typically include a first end 844 and a second end 846, and have a lift pin passage 848 disposed therethrough. The first end 844 of the lift pin guide 838 typically includes an outwardly extending flange 842. The flange 842 is generally seated in a stepped hole 840 disposed through the body 802. The flange 842 generally prevents the lift pin guide 838 from passing through the body 802. The second end 846 of the lift pin guide 838 generally extends through a slot 852 formed through the base plate 806.

Figure 10:
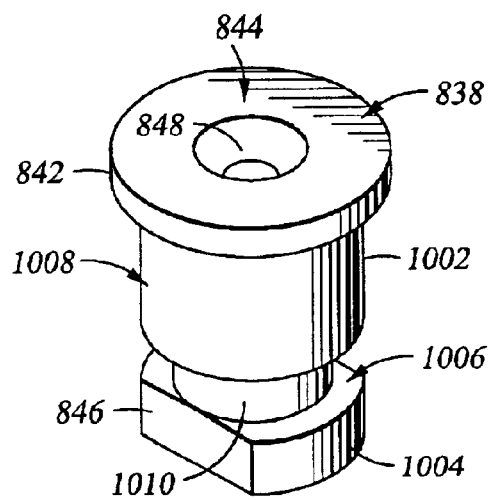
FIG. 10 is a partial sectional view of the support assembly of FIG. 8.

FIG. 10 generally depicts one embodiment of the lift pin guide 836. The lift pin guide 836 generally has a generally cylindrical body 1002 disposed between the flange 842 extending from the body 1002 and a spacer 1010 that has a diameter smaller than the body 1002. The body 1002 and flange 842 are generally cylindrical in form, thereby allowing the guide 836 to be rotated in the stepped hole 840 disposed in the body 802. The second end 846 of the lift pin guide 836 generally includes one or more tabs 1004 extending radially therefrom. The tabs 1004 are separated from the body 1002 by the spacer 1010. The tabs 1004 and body 1002 generally define a gap 1006 across the spacer 1010.

The tabs 1004 are generally configured to pass through the slot 852 in the base plate 806 when the lift pin guide 836 is in a first angular orientation. As the lift pin guide 836 is rotated to a second angular orientation, the tab 1004 rotates over the base plate 806, thereby capturing the base plate 806 in the gap 1006, thereby retaining the base plate 1006 to the body 802.

The body 1002 of the lift pin guide 836 additionally includes a hole 1008 at least partially formed therein. When the lift pin guide 836 is in the second rotation orientation, a pin or similar device may be inserted into the hole 1008, thereby being partially inserted into the hole 1008 to prevent the lift pin guide 836 from returning to its first angular orientation that would allow the base plate 806 to become released. In the embodiment depicted in FIG. 8, a threaded fastener 854 is into the hole 1008 disposed in the lift pin guide 838. The head of the fastener 854 is at least partially disposed in a portion of the slot 852 not occupied by the spacer 1010, thereby preventing rotation of the lift pin guide 838 relative to the body 802.

Figure 11:
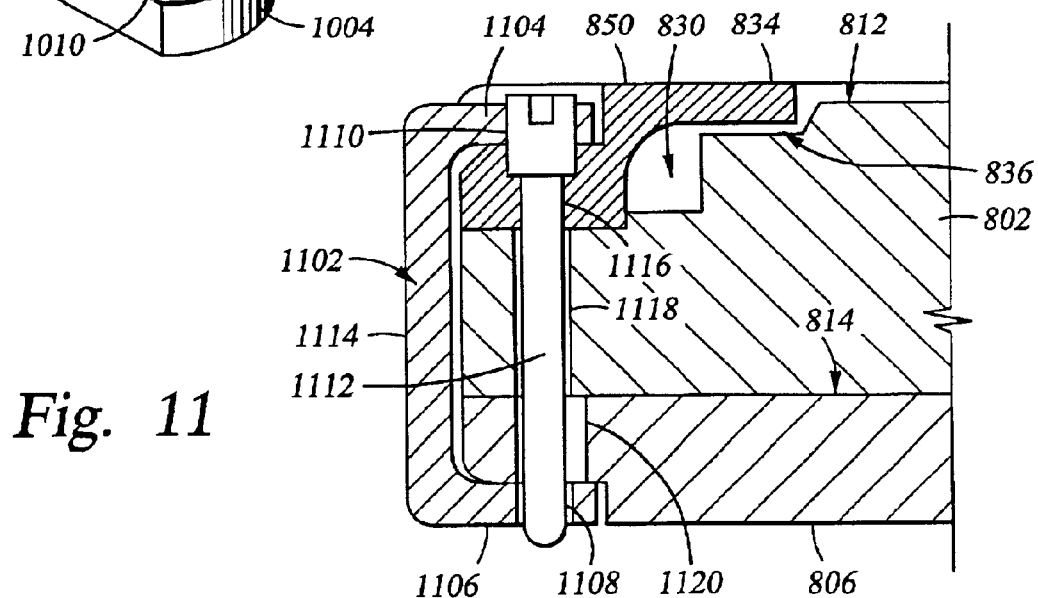
FIG. 11 is a perspective view of one embodiment of a locking lift pin guide.

The base plate 806 may alternatively or additionally be removably attached to the body 802 using other devices or methods. As illustrated in FIG. 11, a clip 1102 may retain the base plate 806 to the purge ring 850 and body 802. The clip 1102 generally has a "C-shaped" cross-section that includes two opposing outer members 1104, 1106 coupled to a center member 1114. Each outer member 1104, 1106 includes a hole 1110, 1108 configured to accept a pin 1112. The pin 1112 passes through the holes 1110, 1108 in the clip 1102 and through holes 1116, 1118, and 1120 respectively formed in the purge ring 850, body 802 and plate 806, thereby retaining the clip 1102 to the support 800 and holding the plate 802 against the body 802. The hole 1120 is generally larger than the holes 1116, 1118 to allow for differences in thermal expansion between the body 802 and plate 806.

Although the teachings of the present invention that have been shown and described in detail herein, those skilled in the art can readily devise other varied embodiments that still incorporate the teachings and do not depart from the scope and spirit of the invention.

What is claimed is:

1. A support assembly for supporting a workpiece, comprising:
   a ceramic body having a first side and a second side disposed opposite the first side, the second side adapted to support the workpiece and having a stepped surface, the stepped surface having a center portion, an intermediate portion and an outer portion, wherein a center portion extends farthest below the first side of the ceramic body;
   a heating element disposed in the ceramic body;
   a plate coupled to the ceramic body; and
   a channel defined between the first side of the ceramic body and a first side of the plate.

2. The support assembly of claim 1, wherein the stepped surface further comprises:
   a plurality of posts extending therefrom.

3. The support assembly of claim 1, wherein the plate is fabricated from at least one material selected from the group of consisting of aluminum nitride, aluminum oxide and aluminum.

4. The support assembly of claim 1, wherein the ceramic body is fabricated from at least one material selected from the group of consisting of aluminum nitride, aluminum oxide or doped ceramics such as alumina doped with titanium oxide or chromium oxide, doped aluminum oxide and doped boron-nitride.

5. The support assembly of claim 1 further comprising:
   a ceramic stem connected to the body.

6. The support assembly of claim 5, wherein the stem is disposed through a hole in the plate.

7. The support assembly of claim 1, wherein the stem further comprises:
   a means for retaining the plate in a position relative to the ceramic body.

8. The support assembly of claim 1 further comprising:
   a plurality of fasteners coupling the plate to the ceramic body.

9. The support assembly of claim 1, where the plate further comprises:
   a plurality of slots; and
   a fastener disposed through at least one slot coupling the plate to the ceramic body.

10. The support assembly of claim 1 further comprising:
    a means for releasably retaining the plate in a position relative to the ceramic body.

11. The support assembly of claim 10, wherein the means for retaining the plate is at least one retention device selected from the group consisting of a brazing material, an adhesive, a fastener, a lift pin guide mating threaded portions, a press fit or a bayonet fitting.

12. The support assembly of claim 11, wherein the means for retaining the plate further comprises:
    a first flange coupled to the ceramic body; that interfaces with a flange in the plate.

13. The support assembly of claim 1 further comprising:
    a ring supported by an end of the body an defining a plenum therewith; and
    a plurality of apertures formed through the body and fluidly communicating with the plenum.

14. The support assembly of claim 1, wherein the ceramic body further comprises:
    a passage formed in and surrounded by the ceramic body, the passage having a first end and a second end both in fluid communication with the same surface of the support body, the first end disposed radially outward of the second end and in communication with the channel.

15. The support assembly of claim 1, wherein the channel is at east partially defined in the ceramic body.

16. The support assembly of claim 1, wherein the channel is at least partially defined in the plate.

17. The support assembly of claim 1, wherein the channel further comprises:
    a first portion having an orientation at least partially circumscribing a center axis of the support assembly; and
    a second portion having plurality of radially extending passages.

18. The support assembly of claim 17, wherein the ceramic body further comprises:
    a plurality of apertures disposed through the ceramic body between the first surface and the second surface and fluidly coupled to the radially extending passages.

19. The support assembly of claim 1, wherein the ceramic body further comprises:
    a vacuum port disposed through the ceramic body.

20. A support assembly for supporting a workpiece comprising:
    a ceramic body having a first side and a second side adapted to support the workpiece;
    a passage formed through the ceramic body having both a first end and a second end in fluid communication with the second side of the ceramic body;

a heating element disposed in the ceramic body;

a plate coupled to the ceramic body;

a channel defined between the first side of the ceramic body and a first side of the plate, the channel in fluid communication with the second end of the passage; and at least one lift pin guide disposed through the body and plate, the lift pin guide having a tab extending radially therefrom and engaging a bottom of the plate, the plate retained by the tab to the body.

21. The support assembly of claim 20, wherein the body further comprises:

a plurality of apertures formed through the body in fluid communication with the channel.

22. A support assembly for supporting a workpiece comprising:

a ceramic body having a first side and a second side adapted to support the workpiece; a stem;

a plate circumscribing the stem and disposed adjacent to the first side of the ceramic body, the stem passing through the plate and coupled to the first side of the ceramic body;

a retaining means for releasably retaining the plate to the ceramic body; and a channel defined between the first side of the ceramic body and a first side of the plate.

23. The support assembly of claim 22, wherein at least a portion of the channel is formed in at least one of the plate or the ceramic body.

24. The support assembly of claim 22, wherein the channel further comprises:

a first portion having an orientation at least partially circumscribing a center axis of the support assembly; and a second portion having plurality of radially extending passages.

25. The support assembly of claim 24, wherein the ceramic body further comprises:

a plurality of apertures disposed through the ceramic body between the first surface and the second surface and fluidly coupled to the radially extending passages.

26. The support assembly of claim 22, where the means further comprises:

a plurality of slots; and a fastener disposed through at least one slot coupling the plate to the ceramic body.

27. The support assembly of claim 22, wherein the means for retaining the plate Is at least one retention device selected from the group consisting of a fastener, a lift pin guide mating threaded portions, a press fit or a bayonet fitting.

28. The support assembly of claim 22, wherein the means for retaining the plate further comprises:

a first flange coupled to the ceramic body that interfaces with a flange in the plate.

29. The support assembly of claim 22, wherein the ceramic body further comprises:

a passage formed in and surrounded by the ceramic body, the passage having a first end and a second end both in fluid communication with the same surface of the support body, the first end disposed radially outward of the second end and in communication with the channel.

30. The support assembly of claim 22 further comprising a ring supported by the body and defining a plenum therewith, the plenum fluidly communicating with the apertures.

* * * * *